(12) United States Patent
Chen et al.

(10) Patent No.: US 9,698,788 B2
(45) Date of Patent: Jul. 4, 2017

(54) INTERFACE DEVICE, RELATED METHOD, AND RELATED OPEN-DRAIN DEVICE

(71) Applicant: SEMICONDUCTOR MANUFACTURING INTERNATIONAL (SHANGHAI) CORPORATION, Shanghai (CN)

(72) Inventors: Jie Chen, Shanghai (CN); Kai Zhu, Shanghai (CN)

(73) Assignee: Semiconductor Manufacturing International Corporation (Shanghai) (CN)

( * ) Notice: Subject to any disclaimer, the term of this patent is extended or adjusted under 35 U.S.C. 154(b) by 0 days.

(21) Appl. No.: 14/960,901

(22) Filed: Dec. 7, 2015

(65) Prior Publication Data

US 2016/0191025 A1 Jun. 30, 2016

(30) Foreign Application Priority Data

Dec. 25, 2014 (CN) .......................... 2014 1 0837907

(51) Int. Cl.
*H03K 3/00* (2006.01)
*H03K 19/0185* (2006.01)

(52) U.S. Cl.
CPC ........................... *H03K 19/018521* (2013.01)

(58) Field of Classification Search
CPC . H03K 17/10; H03K 17/16; H03K 19/018521
USPC ....................................................... 327/108
See application file for complete search history.

(56) References Cited

U.S. PATENT DOCUMENTS

| | | | | |
|---|---|---|---|---|
| 5,387,826 A | * | 2/1995 | Shay | H03K 19/00315 326/21 |
| 5,418,476 A | * | 5/1995 | Strauss | H03K 19/09429 326/58 |
| 5,532,621 A | * | 7/1996 | Kobayashi | G05F 1/465 326/58 |
| 5,552,723 A | * | 9/1996 | Shigehara | H03K 19/00315 326/119 |
| 5,926,056 A | * | 7/1999 | Morris | H03K 19/00315 326/81 |
| 5,933,025 A | * | 8/1999 | Nance | H03K 19/00315 326/81 |
| 6,043,680 A | * | 3/2000 | Dasgupta | H03K 19/00315 326/57 |
| 6,057,717 A | * | 5/2000 | Kawano | H03K 19/018521 326/87 |

(Continued)

*Primary Examiner* — Ryan Jager
(74) *Attorney, Agent, or Firm* — Innovation Counsel LLP (57) ABSTRACT

An interface device may include a first transistor, a pull-up unit, a pull-down unit, a first power supply terminal, a ground terminal, an output signal terminal, and a bias unit. A first gate terminal of the pull-up unit is electrically connected to a source terminal of the first transistor. A drain terminal of the pull-down unit is electrically connected to a drain terminal of the first transistor. The first power supply terminal is electrically connected to a source terminal of the pull-up unit. The ground terminal is electrically connected to a source terminal of the pull-down unit. The output signal terminal is electrically connected to each of a drain terminal of the pull-up unit and the drain terminal of the pull-down unit. An output terminal of the bias unit is electrically connected, without any intervening transistor, to a gate terminal of the first transistor.

16 Claims, 3 Drawing Sheets

(56) References Cited

U.S. PATENT DOCUMENTS

| | | | | |
|---|---|---|---|---|
| 6,333,663 | B1 * | 12/2001 | Lee | G11C 7/1006 |
| | | | | 326/81 |
| 6,373,282 | B1 * | 4/2002 | Drapkin | H03K 19/018507 |
| | | | | 326/68 |
| 6,803,789 | B1 * | 10/2004 | Yu | H03K 19/00315 |
| | | | | 326/27 |
| 7,239,186 | B2 * | 7/2007 | Yu | H03K 19/003 |
| | | | | 326/80 |
| 7,304,511 | B2 * | 12/2007 | Kawano | H03K 19/00315 |
| | | | | 326/82 |
| 7,830,174 | B2 * | 11/2010 | Uno | H03K 19/00315 |
| | | | | 326/27 |
| 2015/0171829 | A1 * | 6/2015 | Song | H03K 17/687 |
| | | | | 327/387 |

* cited by examiner

INTERFACE DEVICE, RELATED METHOD, AND RELATED OPEN-DRAIN DEVICE

CROSS-REFERENCE TO RELATED APPLICATION

This application claims priority to and benefit of Chinese Patent Application No. 201410837907.3, filed on 25 Dec. 2014; the Chinese Patent Application is incorporated herein by reference in its entirety.

BACKGROUND

The technical field is related to an interface device. The interface device may be used in an electric circuit for transmitting and/or receiving signals.

An electric circuit, e.g., an integrated circuit, may include an interface device for transmitting signals to an external circuit and/or for receiving signals from an external circuit. Some of the transmitted signals and/or some of the received signals may have voltages that are higher than the power supply voltage of the electric circuit. If the interface device cannot adequately tolerate the relatively high voltages, performance and/or reliability of the electric circuit and a related electronic device may be unsatisfactory.

SUMMARY

An embodiment may be related to an interface device. The interface device may include a first transistor, a pull-up unit, a pull-down unit, a first power supply terminal, a ground terminal, an output signal terminal, and a bias unit. A first gate terminal of the pull-up unit may be electrically connected to a source terminal of the first transistor. A drain terminal of the pull-down unit may be electrically connected to a drain terminal of the first transistor and a drain terminal of the pull-up unit. The first power supply terminal may be electrically connected to a source terminal of the pull-up unit and may receive a first power supply voltage. The ground terminal may be electrically connected to a source terminal of the pull-down unit and may be electrically grounded (to receive a reference voltage or ground voltage). The output signal terminal may be electrically connected to each of the drain terminal of the pull-up unit, the drain terminal of the pull-down unit, and the drain terminal of the first transistor. An output terminal of the bias unit may be electrically connected, without any intervening transistor, to a gate terminal of the first transistor and may provide a bias voltage to the gate terminal of the first transistor.

The interface device may include an output control signal terminal. The output control signal terminal may be electrically connected to an input terminal of the bias unit and may receive an output control signal.

The interface device may include an input signal terminal, a NAND gate, a NOR gate, and a NOT gate. An output terminal of the NAND gate may be electrically connected to a second gate terminal of the pull-up unit. The input signal terminal may be electrically connected to a first input terminal of the NAND gate and a first input terminal of the NOR gate. An output terminal of the NOR gate may be electrically connected to a gate terminal of the pull-down unit. The output control signal terminal may be electrically connected to a second input terminal of the NOR gate. An output terminal of the NOT gate may be electrically connected to a second input terminal of the NAND gate.

The interface device may include an enable unit. A first gate terminal of the enable unit may be electrically connected to the output terminal of the NOT gate. A drain terminal of the enable unit may be electrically connected to the first gate terminal of the pull-up unit.

The output control signal terminal may be electrically connected to an input terminal of the NOT gate.

The bias unit may include a p-channel transistor, an n-channel transistor, and a second power supply terminal. A source terminal of the p-channel transistor may be electrically connected to the first power supply terminal. A drain terminal of the p-channel transistor may be electrically connected to the gate terminal of the first transistor. A drain terminal of the n-channel transistor may be electrically connected to each of the drain terminal of the p-channel transistor and the gate terminal of the first transistor. The second power supply terminal may be electrically connected to a source terminal of the n-channel transistor and may receive a copy of a second power supply voltage. The second power supply terminal may be insulated from the first power supply terminal and/or the ground terminal. The second power supply voltage may be unequal to the first power supply voltage. A body terminal of the n-channel transistor may be electrically connected to the ground terminal and/or may be electrically grounded (to receive a copy of the reference voltage or ground voltage).

A body terminal of the p-channel transistor may be electrically connected to the first power supply terminal.

The output control signal terminal may be electrically connected to each of a gate terminal of the p-channel transistor and a gate terminal of the n-channel transistor.

An embodiment may be related to a method for operating an interface device. The interface device may include a first transistor, a pull-up unit, and a pull-down unit. A first gate terminal of the pull-up unit may be electrically connected to a source terminal of the first transistor. A drain terminal of the pull-down unit may be electrically connected to a drain terminal of the first transistor. The method may include the following steps: providing a first copy of a first power supply voltage to a source terminal of the pull-up unit; electrically grounding a source terminal of the pull-down unit; and providing a bias voltage from an output terminal of a bias unit to a gate terminal of the first transistor.

During normal transmitting application and open-drain low, the output control signal is low, and the bias unit may output a high level voltage as first power supply. During normal receiving application, idle status and open-drain high, the output control signal is high, and the bias unit may output a low level voltage as second power supply. The bias voltage may be unequal to the first power supply voltage.

The method may include providing a first copy of an output control signal to an input terminal of the bias unit.

The method may include the following steps: providing a first copy of an input signal to a first input terminal of a NAND gate; providing a second copy of the output control signal to an input terminal of a NOT gate; providing a first copy of an output of the NOT gate to a second input terminal of the NAND gate; and providing an output of the NAND gate to a second gate terminal of the pull-up unit.

The method may include providing a second copy of the output of the NOT gate to a gate terminal of an enable unit. A drain terminal of the enable unit may be electrically connected to the first gate terminal of the pull-up unit.

During open-drain application, a value of the input signal may be equal to a value of the output control signal. If the value of the input signal and the value of the output control signal are high, both pull-up unit and pull-down unit are shut off, the output of the interface device may be pulled up by an external resistor that is connect to an external power supply. If the value of the input signal and the output control signal are low, the pull-up unit is shut off, and the pull-down unit is turn on, such that the output of the interface device may be pulled down since the pull-down unit has a much lower equivalent resistance than the external pull-up resistor.

The method may include providing a second power supply voltage to a source terminal of an n-channel transistor of the bias unit. The second power supply voltage may be lower than the first power supply voltage.

The method may include electrically grounding a body terminal of the n-channel transistor of the bias unit. The method may include providing a first power supply voltage to a source terminal of a p-channel transistor of the bias unit. A drain terminal of the p-channel transistor may be electrically connected to a drain terminal of an n-channel transistor.

If the output control signal is low, then the bias unit outputs the high-level first power supply voltage, such that the first transistor is shut off, and the interface device transmits input signal.

If the output control signal is high, then the bias unit outputs the low-level second power supply voltage, such that the first transistor is turned on, and the interface device in an idle state.

An open drain application may involve an external power supply voltage higher than first power supply voltage. When the interface device is in an idle state, the output of the interface device is pulled up to the external power supply voltage by an external resistor. Since the first transistor is turned on, the voltage at the first gate of the pull-up unit is equal to the output of the interface device, which is equal to the external power supply. A first body of the pull-up unit may receive a n-well bias voltage, which is equal to the external power supply voltage (high select), such that a transistor in the pull-up unit is shut off by both gate end and body end, and there will be no back stream from the external power supply to first power supply.

The conductive point of first transistor is substantially early because of the structure and operation involving the bias unit. The charge current at the first transistor (and at the output terminal) may attenuate along with rising of the output voltage. Therefore, the charge current is much bigger when the output voltage at 1.2 V than at 3.3 V. According to embodiments, the waveform of the charge current may have substantially no distortion or minimum distortion.

An embodiment may be related to an interface device for outputting an output voltage at an output terminal. The interface device may include a pull-up unit, a pull-down unit, a bias unit, and an inhibit unit.

The pull up unit may receive a first signal set related to an output control signal and an input signal for providing a first first-type impedance path (e.g., first low impedance path) or a first second-type impedance path (first high impedance path) between a first supply voltage terminal and the output terminal. The first second-type impedance path may be provided when either the output control signal or the input signal has a first logic value (e.g., low value). The first first-type impedance path may be provided when both the output control signal and the input signal have a second logic value (e.g., high value). The first supply voltage terminal may receive a first supply voltage. The pull-up unit may receive a body-terminal bias voltage. The body-terminal bias voltage may be equal to the output voltage if the output voltage provided when the pull-up unit provides the first second-type impedance path is greater than the first supply voltage. The body-terminal bias voltage may be equal to the first supply voltage if the output voltage provided when the pull-up unit provides the first second-type impedance path is less than the first supply voltage;

The pull-down unit may receive a second signal set related to the output control signal and the input signal for providing a second first-type impedance path or a second second-type -impedance path between the output terminal and a reference voltage terminal. The second first-type impedance path may be provided when the output control signal has the second logic value and the input signal has the first logic value. The second second-type impedance path may be provided when the output control signal has the first logic value or the input signal has the second logic value. The reference voltage terminal may be configured to receive a reference voltage.

The bias unit may receive a signal related to the output control signal for outputting a bias voltage.

The inhibit unit may receive the bias voltage for operating the pull-up unit to block an electrical connection between the output terminal and the first supply voltage terminal when the pull-up unit provides the first second-type impedance path.

An embodiment may be related to an interface device. The interface device may include a pull up unit, responsive to a first signal set related to an output control signal and an input data signal, for providing a low or high impedance path between a first supply voltage and an output node. The low impedance path is present when the output control signal and the input data signal are both a logic high, the high impedance path is present when the either the output control signal or the input data signal is a logic low, and the pull-up unit is connected to a substrate bias voltage that is the greater of the output voltage when the pull-up unit has a high-impedance path and the first supply voltage. The interface device may further include a pull-down unit, responsive to a second signal set related to the output control signal and the input data signal, for providing a low or high-impedance path between the output node and a second supply voltage. The low impedance path is present when the output control signal is a logic high and the input data signal is a logic low, and the high impedance path is present when the output control signal is a logic low or the input data signal is a logic high. The interface device may further include a bias unit, responsive to a signal related to the output control signal for outputting a bias voltage. The interface device may further include an inhibit unit, responsive to the bias voltage for operating on the pull-up unit to block conduction from the output node to the first supply voltage when the pull-up unit provides a high impedance.

An embodiment may be related to an open-drain device. The open-drain device may have features of the above-described interface devices and open drain application.

According to embodiments, an interface device may be compatible with a relatively high voltage at an output terminal of the interface device, wherein the voltage at the output terminal may be higher than an operating power supply voltage. According to embodiments, waveform distortion of a charge current at an output terminal of the interface device may be minimized. Advantageously, reliability and/or performance of the interface device and one or more related devices may be satisfactory.

The above summary is related to some of many embodiments disclosed herein and is not intended to limit the scope of embodiments.

DETAILED DESCRIPTION

Example embodiments are described with reference to the accompanying drawings. As those skilled in the art would realize, the described embodiments may be modified in various different ways, all without departing from the spirit or scope. Embodiments may be practiced without some or all of these specific details. Well known process steps and/or structures may not have been described in detail in order to not unnecessarily obscure described embodiments.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting possible embodiments. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements should not be limited by these terms. These terms may be used to distinguish one element from another element. Thus, a first element discussed below may be termed a second element without departing from embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may be provided between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the embodiments. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate". The term "conductive" may mean "electrically conductive". The term "electrically connected" may mean "electrically connected without any intervening transistors".

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, embodiments may also cover apparatuses for practicing embodiments. Such apparatus may include circuits, dedicated and/or programmable, to carry out operations pertaining to embodiments. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments.

Figure 1:
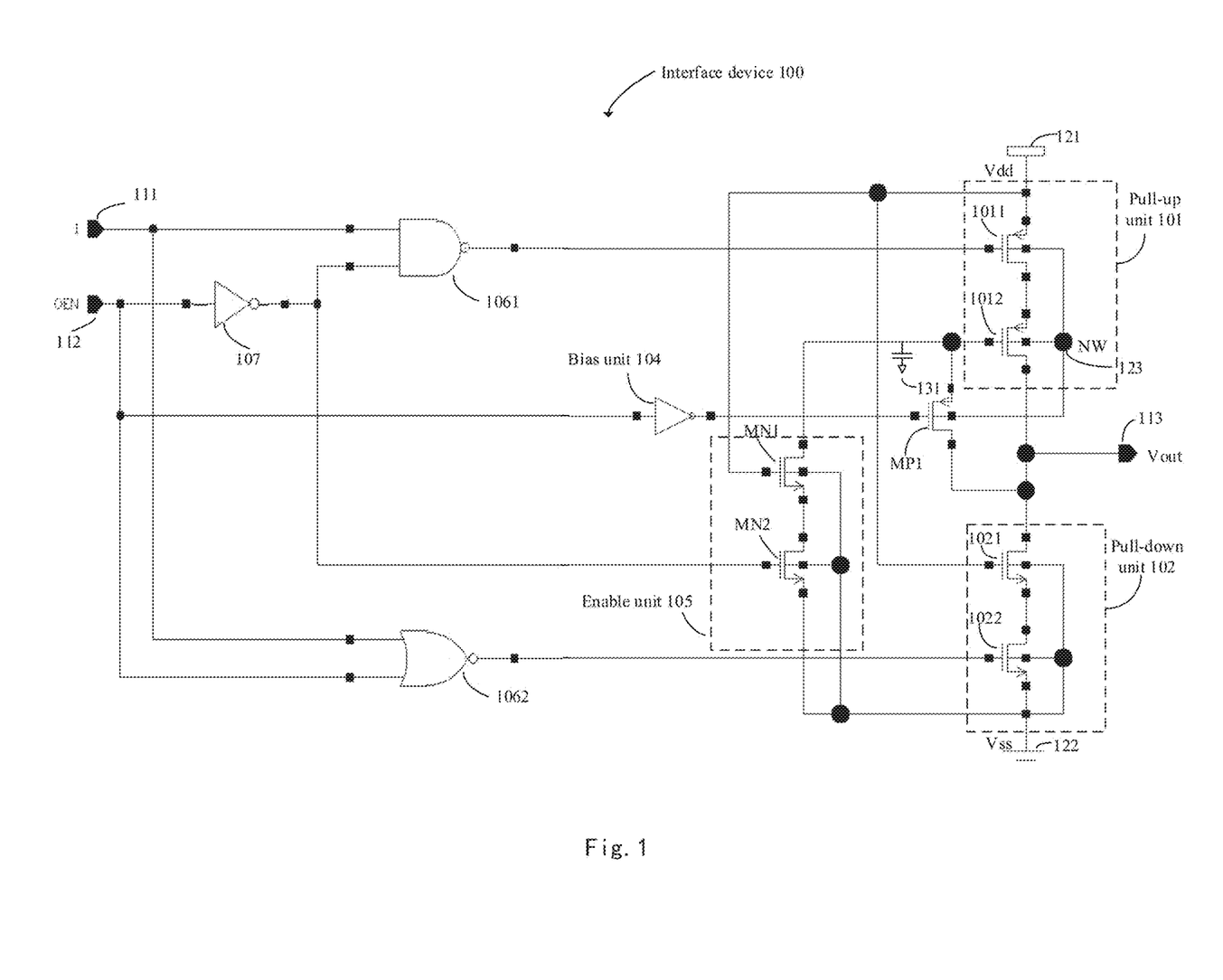
FIG. 1 shows a schematic diagram (e.g., a schematic circuit diagram) that illustrates elements and/or structures in an interface device in accordance with one or more embodiments.
Figure 2:
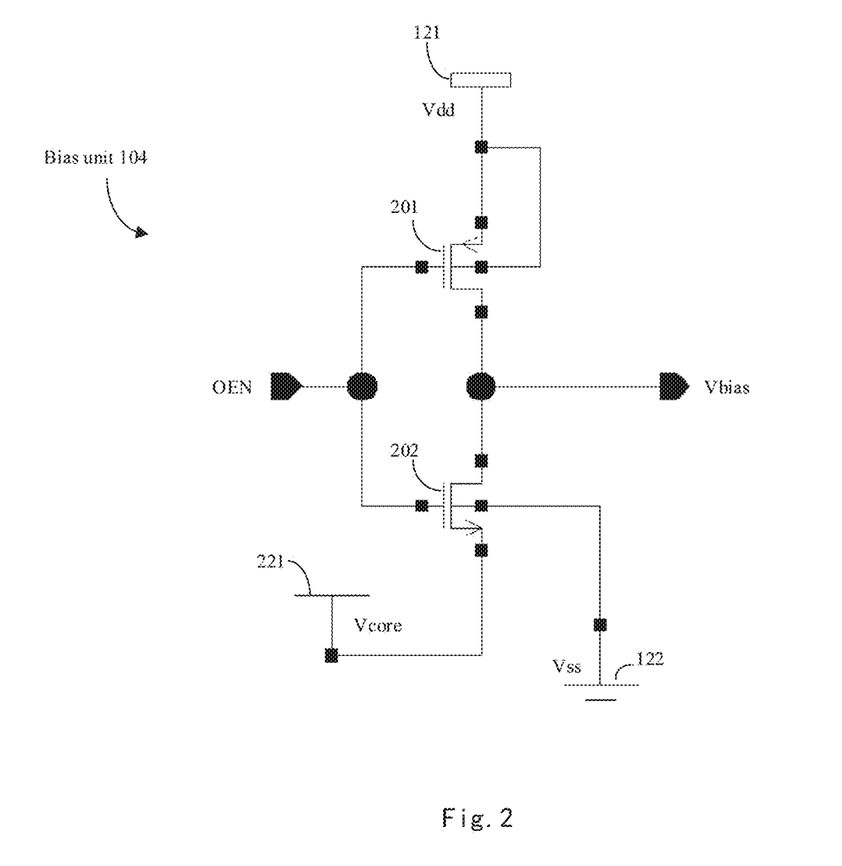
FIG. 2 shows a schematic diagram (e.g., a schematic circuit diagram) that illustrates elements and/or structures in a bias unit of an interface device in accordance with one or more embodiments.

FIG. 1 shows a schematic diagram (e.g., a schematic circuit diagram) that illustrates elements and/or structures in an interface device 100 in accordance with one or more embodiments. FIG. 2 shows a schematic diagram (e.g., a schematic circuit diagram) that illustrates elements and/or structures in a bias unit 104 of the interface device 100 in accordance with one or more embodiments. As an example, the interface device 100 may function as an output buffer of an integrated circuit. The interface device 100 may include one or more of an input signal terminal 111, an output control signal terminal 112, a first power supply terminal 121, a ground terminal 122, an output signal terminal 113, an n-well bias node 123, a transistor MP1 (an inhibit transistor), a pull-up unit 101, a pull-down unit 102, the bias unit 104, a NAND gate 1061, a NOT gate 107 (or inverter 107), an enable unit 105, and a NOR gate 1062.

In an embodiment, the interface device 100 may include a level-adjustment unit. The level-adjustment unit may be electrically connected between a (relatively) high power domain and a (relatively) low power domain. The level-adjustment unit may facilitate signal transmission and/or electrical connections between elements in the high power domain and the low power domain. Elements in the high power domain may include one or more of the transistor MP1, the pull-up unit 101, the pull-down unit 102, the first power supply terminal 121, the ground terminal 122, the output signal terminal 113, the bias unit 104, and the enable unit 105. Elements in the low power domain may include one or more of the NAND gate 1061, the NOT gate 107, and the NOR gate 1062.

The input signal terminal 111 may represent the input terminal of the interface device 100 and may receive an input signal I. The output control signal terminal 112 may receive an output control signal OEN for controlling output of the interface device 100. The first power supply terminal 121 may receive a first power supply voltage Vdd. As an example, the first power supply voltage Vdd may have a value of 3.3 V. The ground terminal 122 may be electrically grounded to receive a reference voltage Vss (or ground voltage Vss). For example, the reference voltage Vss may have a reference value of 0 V. The output signal terminal 113 may represent the output terminal of the interface device 100 and may have an output voltageVout. The output signal terminal 113 may be electrically connected to each of a drain terminal of the pull-up unit 101, a drain terminal of the pull-down unit 102, and a drain terminal of the transistor MP1. The n-well bias node 123 may have an n-well bias voltage NW. A value of the n-well bias voltage NW may depend on (the higher value of) a value of the first power supply voltage Vdd and a value of the output voltageVout.

The transistor MP1 may be a p-channel transistor, such as a p-channel metal-oxide-semiconductor field-effect transistor, or PMOS transistor. The gate terminal of the transistor MP1 may be electrically connected, without any intervening transistor, to the output terminal of the bias unit 104. The source terminal of the transistor MP1 may be electrically connected to a first gate terminal of the pull-up unit 101. The drain terminal of the transistor MP1 may be electrically connected to the output signal terminal 113. The body terminal of the transistor MP1 may be electrically connected to the n-well bias node 123.

The pull-up unit 101 may include a transistor 1011 and a transistor 1012. The transistors 1011 and 1012 may be PMOS transistors. The first gate terminal of the pull-up unit 101, e.g., the gate terminal of the transistor 1012, may be electrically connected to the source terminal of the transistor MP1. A source terminal of the pull-up unit 101, e.g., the source terminal of the transistor 1011, may be electrically connected to the first power supply terminal 121 and may receive a copy of the first power supply voltage Vdd. A drain terminal of the pull-up unit 101, e.g., the drain terminal of the transistor 1012, may be electrically connected to the output signal terminal 113. The source terminal of the transistor 1012 may be electrically connected to the drain terminal of the transistor 1011. The body terminal of the transistor 1011 and the body of the transistor 1012 may be electrically connected to the n-well bias node 123.

The pull-down unit 102 may include a transistor 1021 and a transistor 1022. The transistors 1021 and 1022 may be n-channel metal-oxide-semiconductor field-effect transistors, or NMOS transistors. A first gate terminal of the pull-down unit 102, e.g., the gate terminal of the transistor 1021, may be electrically connected to the first power supply terminal 121 and may receive a copy of the first power supply voltage Vdd. A source terminal of the pull-down unit 102, e.g., the source terminal of the transistor 1022, may be electrically connected to the ground terminal 122 and may receive a copy of the reference voltage Vss. A drain terminal of the pull-down unit 102, e.g., the drain terminal of the transistor 1021, may be electrically connected to each of the output signal terminal 113, the drain terminal of the transistor MP1, and a drain terminal of the pull-up transistor 101 (e.g., the drain terminal of the transistor 1012). The source terminal of the transistor 1021 may be electrically connected to the drain terminal of the transistor 1022. The body terminal of the transistor 1021 may be electrically connected to the body terminal of the transistor 1022.

The input terminal of the bias unit 104 may be electrically connected (without any intervening transistor) to the output control signal terminal 112 and may receive a copy of the output enable control signal OEN. The output terminal of the bias unit 104 may be electrically connected (without any intervening transistor) to the gate terminal of the transistor MP1 and may provide a bias voltage Vbias to the gate terminal of the transistor MP1. The bias voltage Vbias may be unequal to the first power supply voltage Vdd. The bias voltage Vbias may be less than the first power supply voltage Vdd. The bias unit 104 may include a second power supply terminal 221, a transistor 201, and a transistor 202.

The second power supply terminal 221 may receive a second power supply voltage Vcore. The second power supply voltage Vcore may be unequal to the first power supply voltage Vdd. The second power supply voltage Vcore may be less than the first power supply voltage Vdd. The second power supply voltage Vcore may be unequal to the reference voltage Vss. The second power supply voltage Vcore may be greater than the reference voltage Vss. As an example, the second power supply voltage Vcore may have a value of 1.2 V. The second power supply terminal 221 may be electrically connected to the source terminal of the transistor 202. The second power supply terminal 221 may be insulated from the first power supply terminal 121 and/or the ground terminal 122.

The transistor 201 may be a p-channel transistor, such as a PMOS transistor. The gate terminal of the transistor 201 may be electrically connected to each of the gate terminal of the transistor 202, the input terminal of the bias unit 104, and the output control signal terminal 112 and may receive a copy of the output control signal OEN. The source terminal of the transistor 201 may be electrically connected to the first power supply terminal 121 and may receive a copy of the first power supply voltage Vdd. The body terminal of the transistor 201 may be electrically connected to the first power supply terminal 121 and may receive a copy of the first power supply voltage Vdd. The drain terminal of the transistor 201 may be electrically connected to each of the drain terminal of the transistor 202, the output terminal of the bias unit 104, and the gate terminal of the transistor MP1.

The transistor 202 may be an n-channel transistor, such as an NMOS transistor. The gate terminal of the transistor 202 may be electrically connected to each of the gate terminal of the transistor 201, the input terminal of the bias unit 104, and the output control signal terminal 112 and may receive a copy of the output control signal OEN. The source terminal of the transistor 202 may be electrically connected to the second power supply terminal 221 and may receive a copy of the second power supply voltage Vcore. The body terminal of the transistor 202 may be electrically connected to the ground terminal 122 and may be electrically grounded (to receive a copy of the reference voltage Vss). The drain terminal of the transistor 202 may be electrically connected to each of the drain terminal of the transistor 201, the output terminal of the bias unit 104, and the gate terminal of the transistor MP1.

A first input terminal of the NAND gate 1061 may be electrically connected to the input signal terminal 111 and may receive a copy of the input signal I. A second input terminal of the NAND gate 1061 may be electrically connected to the output terminal of the NOT gate 107. The output terminal of the NAND gate 1061 may be electrically connected to a second gate terminal of the pull-up unit 101, e.g., the gate terminal of the transistor 1011.

The input terminal of the NOT gate 107 may be electrically connected to the output control signal terminal 112 and may receive a copy of the output control signal OEN. The output terminal of the NOT gate 107 may be electrically connected to each of the second input terminal of the NAND gate 1061 and a first gate terminal of the enable unit 105.

A first input terminal of the NOR gate 1062 may be electrically connected to the input signal terminal 111 and may receive a copy of the input signal I. A second input terminal of the NOR gate 1062 may be electrically connected to the output control signal terminal 112 and may receive a copy of the output control signal OEN. The output terminal of the NOR gate 1062 may be electrically connected to the gate terminal of the transistor 1022 of the pull-down unit 102.

The enable unit 105 may include a transistor MN1 and a transistor MN2. The transistor MN1 may be an n-channel transistor, such as an NMOS transistor. The transistor MN2 may be an n-channel transistor, such as an NMOS transistor. The first gate terminal of the enable unit 105, e.g., the gate terminal of the transistor MN2, may be electrically connected to the output terminal of the NOT gate 107. A second gate terminal of the enable unit 105, e.g., the gate terminal of the transistor MN1, may be electrically connected to the first power supply terminal 121 and may receive a copy of the first power supply voltage Vdd. A drain terminal of the enable unit 105, e.g., the drain terminal of the transistor MN1, may be electrically connected to each of the source terminal of the transistor MP1 and the first gate terminal of the pull-up unit 101, e.g., the gate terminal of the transistor 1012. A source terminal of the enable unit 105, e.g., the source terminal of the transistor MN2, may be electrically connected to the ground terminal 122 and may be electrically grounded. The drain terminal of the transistor MN2 may be electrically connected to the source terminal of the transistor MN1. Each of the body terminal of the transistor MN1 and the body terminal of the transistor MN2 may be electrically connected to the ground terminal 122 and may be electrically grounded.

The method for operating the interface device 100 may include the following steps: providing a first copy of a first power supply voltage Vdd to a source terminal of the pull-up unit 101 (e.g., the source terminal of the transistor 1011); electrically grounding a source terminal of the pull-down unit 102 (e.g., the source terminal of the transistor 1022); providing a first copy of an output control signal OEN to the input terminal of the bias unit 104; and providing a bias voltage Vbias from the output terminal of the bias unit 104 to the gate terminal of the transistor MP1. The bias voltage Vbias may be unequal to the first power supply voltage Vdd. The bias voltage Vbias may be less than the first power supply voltage Vdd.

The method may include the following steps: providing a first copy of an input signal I to a first input terminal of the NAND gate 1061; providing a second copy of the output control signal OEN to an input terminal of the NOT gate 107; providing a first copy of an output of the NOT gate 107 to a second input terminal of the NAND gate 1061; and providing an output of the NAND gate 1061 to the gate terminal of the transistor 1011 of the pull-up unit 101.

The method may include providing a second copy of the output of the NOT gate 107 to the gate terminal of the transistor MN2 of the enable unit 105. The drain terminal of the transistor MN1 of the enable unit 105 may be electrically connected to the gate terminal of the transistor 1012 of the pull-up unit 101.

In an open drain application, the input signal terminal 111 may be electrically connected to the output control signal terminal 112, and a value of the input signal I may be substantially equal to a value of the output control signal OEN.

The method may include providing a copy of a second power supply voltage Vcore to the source terminal of the transistor 202 of the bias unit 104. The second power supply voltage Vcore may be unequal to the first power supply voltage Vdd. The second power supply voltage Vcore may be less than the first power supply voltage Vdd. The method may include electrically grounding the body terminal of the transistor 202 of the bias unit 104.

Figure 3:
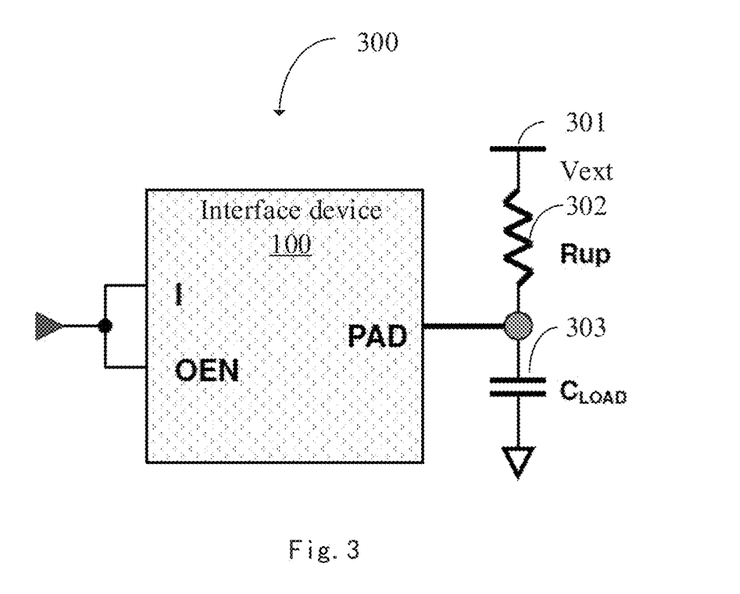
FIG. 3 shows a schematic diagram that illustrates elements and/or structures in an open-drain device in accordance with one or more embodiments.

FIG. 3 shows a schematic diagram that illustrates elements and/or structures in an open-drain device 300 in accordance with one or more embodiments. The open-drain device may represent an open-drain application involving the interface device 100 The open-drain device 300 may include the interface device 100, an external voltage terminal 301, a resistor 302, and a capacitor 303. In the interface device 100, the input signal terminal 111 may be electrically connected to the output control signal terminal 112, and a value of the input signal I may be substantially equal to a value of the output control signal OEN. The output signal terminal 113 of the interface device 100 may be electrically connected through the resistor 302 to the external voltage terminal 301 and may be electrically connected to a first terminal of the capacitor 303. The external voltage terminal 301 may receive an external voltage Vext. A value of the external voltage Vext may be greater than a value of the first power supply voltage Vdd. As an example, the external voltage Vext may have a value of 5 V. The resistor 302 may have a resistance Rup and may be electrically connected between the external voltage terminal 301 and the capacitor 303. A second terminal of the capacitor 303 may be electrically grounded. The capacitor 303 may have a capacitance $C_{LOAD}$.

If the output control signal OEN is low, then the bias unit 104 may output the high-level first power supply voltage Vdd as the bias voltage Vbias, such that the first transistor MP1 may be shut off, and the interface device 100 may transmit the input signal I.

If the output control signal OEN is high, then bias unit 104 may output the low-level second power supply voltage Vcore as the bias voltage Vbias, such that the first transistor MP1 may be turned on, and the interface device 100 may be in an idle state.

In the open drain application, the external voltage Vext may be higher than first power supply voltage Vdd. When the interface device 100 is idle, the output voltage Vout of the interface device 100 may be pulled up to the external voltage Vext by the resistor 302. Since the first transistor MP1 is turned on, the voltage at the gate terminal of the transistor 1012 of the pull-up unit 101 is equal to the output voltage Vout, which is equal to external voltage Vext. The body terminal of the transistor 1012 of the pull-up unit 101 receives the n-well bias voltage NW, which may be equal to the external voltage Vext. Therefore, the transistor 1012 is shut off by both the gate end and the body end. As a result, there will be no back stream from external the external voltage terminal 301 to the first power supply terminal 121.

In the open-drain application, a value of the input signal I may be equal to a value of the output control signal OEN. If the value of input signal I and the value of the output control signal OEN are high, both the pull-up unit 101, and the pull-down unit 102 are shut off, such that the output voltage Vout of the interface device 100 may be pulled up by the resistor 302, which is connect to the external power supply Vext. If the value of the input signal I and the value of the output control signal are low, the pull-up unit 101 is shut off, and the pull-down unit 102 is turn on, such that the output voltage Vout of the interface device 100 will be pulled down (to the reference voltage Vss) because the pull-down unit 102 has a much lower equivalent resistance than the external pull-up resistor 302.

According to embodiments, the conductive point of the first transistor MP1 is substantial early because of the structure and operation involving the bias unit 104. When the input signal I and the output control signal OEN are logic high, the bias unit 104 may output the second power supply voltage Vcore, which is less than first power supply voltage Vdd and is logic low. Accordingly, the transistor MP1 may become conductive and may start to charge the parasitical large capacitor through external pull-up resistor 302. The amount of the charge current at the transistor MP1 and at the output terminal 113 may depend on the voltage drop of the pull-up resistor 302: a larger voltage drop unit a larger charge current. A larger charge current can charge the parasitical large capacitor faster. Therefore, the waveform of the current at the first transistor MP1 and at the output terminal 113 may have substantially no distortion or minimum distortion. The charge current may attenuate along with rising of the output voltage Vout. Therefore, the charge current is much bigger when the output voltage Vout is at 1.2 V than at 3.3 V. According to embodiments, the waveform of the current at the first transistor MP1 may have substantially no distortion or minimum distortion.

The structure of the interface device 100 may enable the open-drain device 300 to be compatible with an external voltage Vext (e.g., 5 V) that is substantially higher than the first power supply voltage (e.g., 3.3 V). The interface device 100 may enable satisfactory voltage tolerance.

In the open-drain device 300, the bias voltage Vbias provided from the bias unit 104 to the transistor MP1 may enable optimization of the output voltage Vout and/or a related charge current given the presence of the external voltage Vext. Therefore, waveform distortion associated with the output voltage Vout and/or waveform distortion associated with the related charge current may be minimized or substantially prevented.

An embodiment may be related to an interface device. The interface device may include a pull up unit, responsive to a first signal set related to an output control signal and an input data signal, for providing a low or high impedance path between a first supply voltage and an output node. The low impedance path is present when the output control signal and the input data signal are both a logic high, the high impedance path is present when the either the output control signal or the input data signal is a logic low, and the pull-up unit is connected to a substrate bias voltage that is the greater of the output voltage when the pull-up unit has a high-impedance path and the first supply voltage. The interface device may further include a pull-down unit, responsive to a second signal set related to the output control signal and the input data signal, for providing a low or high-impedance path between the output node and a second supply voltage. The low impedance path is present when the output control signal is a logic high and the input data signal is a logic low, and the high impedance path is present when the output control signal is a logic low or the input data signal is a logic high. The interface device may further include a bias unit, responsive to a signal related to the output control signal for outputting a bias voltage. The interface device may further include an inhibit unit, responsive to the bias voltage for operating on the pull-up unit to block conduction from the output node to the first supply voltage when the pull-up unit provides a high impedance.

According to embodiments, an interface device may be compatible with a relatively high voltage at an output terminal of the interface device, wherein the voltage at the output terminal may be higher than an operating power supply voltage. According to embodiments, waveform distortion of a charge current at an output terminal of the interface device may be minimized. Advantageously, reliability and/or performance of the interface device and one or more related devices may be satisfactory.

While some embodiments have been described as examples, there are alterations, permutations, and equivalents. It should also be noted that there are many alternative ways of implementing the methods and apparatuses. Furthermore, embodiments may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents.

What is claimed is:

1. An interface device comprising:
 a first transistor;
 a pull-up unit, wherein a first gate terminal of the pull-up unit is electrically connected to a source terminal of the first transistor;
 a pull-down unit, wherein a drain terminal of the pull-down unit is electrically connected to a drain terminal of the first transistor;
 a first power supply terminal, which is electrically connected to a source terminal of the pull-up unit;
 a ground terminal, which is electrically connected to a source terminal of the pull-down unit;
 an output signal terminal, which is electrically connected to each of a drain terminal of the pull-up unit and the drain terminal of the pull-down unit; and
 a bias unit, wherein an output terminal of the bias unit is electrically connected to a gate terminal of the first transistor, and wherein the bias unit comprises:
  a p-channel transistor, wherein a source terminal of the p-channel transistor is electrically connected to the first power supply terminal, and wherein a drain terminal of the p-channel transistor is electrically connected to the gate terminal of the first transistor;

an n-channel transistor, wherein a drain terminal of the n-channel transistor is electrically connected to each of the drain terminal of the p-channel transistor and the gate terminal of the first transistor: and a second power supply terminal, which is electrically connected to a source terminal of the n-channel transistor.

2. The interface device of claim 1, comprising:
an output control signal terminal, which is electrically connected to an input terminal of the bias unit.

3. The interface device of claim 2, comprising:
a NAND gate, wherein an output terminal of the NAND gate is electrically connected to a second gate terminal of the pull-up unit;
an input signal terminal, which is electrically connected to a first input terminal of the NAND gate;
a NOT gate, wherein an output terminal of the NOT gate is electrically connected to a second input terminal of the NAND gate.

4. The interface device of claim 3, comprising:
an enable unit, wherein a first gate terminal of the enable unit is electrically connected to the output terminal of the NOT gate, and wherein a drain terminal of the enable unit is electrically connected to the first gate terminal of the pull-up unit.

5. The interface device of claim 1, wherein a body terminal of the n-channel transistor is electrically connected to the ground terminal.

6. The interface device of claim 1, wherein a body terminal of the p-channel transistor is electrically connected to the first power supply terminal.

7. The interface device of claim 1, comprising:
an output control signal terminal, which is electrically connected to each of a gate terminal of the p-channel transistor and a gate terminal of the n-channel transistor.

8. A method for operating an interface device, the interface device comprising a first transistor, a pull-up unit, and a pull-down unit, a first gate terminal of the pull-up unit being electrically connected to a source terminal of the first transistor, a drain terminal of the pull-down unit being electrically connected to a drain terminal of the first transistor, the method comprising:
providing a first copy of a first power supply voltage to a source terminal of the pull-up unit;
electrically grounding a source terminal of the pull-down unit;
providing a bias voltage from an output terminal of a bias unit to a gate terminal of the first transistor; and
providing a second power supply voltage to a source terminal of an n-channel transistor of the bias unit, wherein the second power supply voltage is unequal to the first power supply voltage.

9. The method of claim 8, comprising:
providing a first copy of an output control signal to an input terminal of the bias unit.

10. The method of claim 8, comprising:
providing a first copy of an input signal to a first input terminal of a NAND gate;
providing a second copy of the output control signal to an input terminal of a NOT gate;
providing a first copy of an output of the NOT gate to a second input terminal of the NAND gate; and
providing an output of the NAND gate to a second gate terminal of the pull-up unit.

11. The method of claim 10, comprising:
providing a second copy of the output of the NOT gate to a gate terminal of an enable unit, wherein a drain terminal of the enable unit is electrically connected to the first gate terminal of the pull-up unit.

12. The method of claim 11, comprising:
providing a second copy of the output control signal to an input terminal of the NOT gate.

13. The method of claim 10, wherein a value of the input signal is equal to a value of the output control signal.

14. The method of claim 8, comprising:
electrically grounding a body terminal of the n-channel transistor of the bias unit.

15. An interface device for outputting an output voltage at an output terminal, the interface device comprising:
a pull up unit, which is configured to receive a first signal set related to an output control signal and an input signal for providing a first first-type impedance path or a first second-type impedance path between a first power supply terminal and the output terminal, wherein the first second-type impedance path is provided when either the output control signal or the input signal has a first logic value, wherein the first first-type impedance path is provided when both the output control signal and the input signal have a second logic value, wherein the first power supply terminal is configured to receive a first supply voltage, wherein the pull-up unit is configured to receive a body-terminal bias voltage, wherein the body-terminal bias voltage is equal to the output voltage if the output voltage provided when the pull-up unit provides the first second-type impedance path is greater than the first supply voltage, and wherein the body-terminal bias voltage is equal to the first supply voltage if the output voltage provided when the pull-up unit provides the first second-type impedance path is less than the first supply voltage;
a pull-down unit, which is configured to receive a second signal set related to the output control signal and the input signal for providing a second first-type impedance path or a second second-type-impedance path between the output terminal and a reference voltage terminal, wherein the second first-type impedance path is provided when the output control signal has the second logic value and the input signal has the first logic value, wherein the second second-type impedance path is provided when the output control signal has the first logic value or the input signal has the second logic value, and wherein the reference voltage terminal is configured to receive a reference voltage;
a bias unit, which is configured to receive a signal related to the output control signal for outputting a bias voltage, wherein the bias unit comprises:
a p-channel transistor, wherein a source terminal of the p-channel transistor is electrically connected to the first power supply terminal, and wherein a drain terminal of the p-channel transistor is electrically connected to a gate terminal of a first transistor;
an n-channel transistor, wherein a drain terminal of the n-channel transistor is electrically connected to each of the drain terminal of the p-channel transistor and the gate terminal of the first transistor; and
a second power supply terminal, which is electrically connected to a source terminal of the n-channel transistor; and
an inhibit unit, which is configured to receive the bias voltage for operating the pull-up unit to block an electrical connection between the output terminal and the first power supply terminal when the pull-up unit provides the first second-type impedance path.

16. The interface device of claim 15, wherein a body terminal of the n-channel transistor is electrically connected to the reference voltage terminal, and wherein a body terminal of the p-channel transistor is electrically connected to the first power supply terminal.

* * * * *